United States Patent
Zampardi et al.

(10) Patent No.: US 9,741,834 B2
(45) Date of Patent: Aug. 22, 2017

(54) HETEROJUNCTION BIPOLAR TRANSISTOR ARCHITECTURE

(71) Applicant: Qorvo US, Inc., Greensboro, NC (US)

(72) Inventors: Peter J. Zampardi, Newbury Park, CA (US); Brian G. Moser, Jamestown, NC (US); Jing Zhang, Greensboro, NC (US); Thomas James Rogers, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/083,566

(22) Filed: Mar. 29, 2016

(65) Prior Publication Data

US 2016/0293700 A1 Oct. 6, 2016

Related U.S. Application Data (60) Provisional application No. 62/142,203, filed on Apr. 2, 2015.

(51) Int. Cl.
*H01L 29/73* (2006.01)
*H01L 29/737* (2006.01)
*H01L 29/08* (2006.01)
*H01L 29/205* (2006.01)

(52) U.S. Cl.
CPC ...... *H01L 29/7371* (2013.01); *H01L 29/0821* (2013.01); *H01L 29/205* (2013.01)

(58) Field of Classification Search
CPC ............ H01L 29/0821; H01L 29/0826; H01L 29/737; H01L 29/7371; H01L 29/66242
See application file for complete search history.

(56) References Cited

U.S. PATENT DOCUMENTS

| | | | | |
|---|---|---|---|---|
| 3,639,815 A | * | 2/1972 | Ernick | H01L 23/3157 148/DIG. 122 |
| 3,798,079 A | * | 3/1974 | Chu | H01L 23/3157 148/33.5 |
| 3,872,494 A | * | 3/1975 | Davis, Jr. | H01L 21/00 257/586 |
| 3,964,089 A | * | 6/1976 | Poon | H01L 29/0821 148/DIG. 67 |
| 5,336,926 A | * | 8/1994 | Matthews | H01L 21/8249 257/370 |

(Continued)

OTHER PUBLICATIONS

Humphreys, M.J. et al., "Some observations on the failure locus of npn transistors and its improvement using graded collector structures," IEE Proceedings, vol. 135, Pt. 1, No. 4, Aug. 1988, pp. 85-90.

(Continued)

*Primary Examiner* — Michele Fan
(74) *Attorney, Agent, or Firm* — Withrow & Terranova, P.L.L.C.

(57) ABSTRACT

A transistor includes a sub-collector, a base, a collector between the sub-collector and the base, and an emitter on the base opposite the collector. The collector includes a first region adjacent to the base and a second region between the first region and the sub-collector. The first region has a graduated doping profile such that a doping concentration of the first region decreases in proportion to a distance from the base. The second region has a substantially constant doping profile. By providing the collector with a doping profile as described, the linearity of the transistor is significantly improved while maintaining the radio frequency (RF) gain thereof.

20 Claims, 5 Drawing Sheets

(56) References Cited

U.S. PATENT DOCUMENTS

| | | | |
|---|---|---|---|
| 5,581,115 A * | 12/1996 | Grubisich | H01L 29/0804 257/592 |
| 7,012,288 B2 | 3/2006 | Lee et al. | |
| 9,054,065 B2 | 6/2015 | Zampardi, Jr. | |
| 9,070,732 B2 | 6/2015 | Zampardi, Jr. et al. | |
| 2004/0188712 A1 * | 9/2004 | Lee | H01L 29/7371 257/197 |
| 2013/0285120 A1 * | 10/2013 | Zampardi, Jr. | H01L 29/36 257/197 |
| 2014/0002188 A1 * | 1/2014 | Chen | H01L 24/85 330/250 |

OTHER PUBLICATIONS

Chiu, L. C. et al., "Graded collector heterojunction bipolar transistor," Applied Physics Letters, vol. 44, No. 1, Jan. 1, 1984, pp. 105-106.

Dow, M. et al., "Investigation Into the Survival of Epitaxial Bipolar Transistors in Current Mode Second Breakdown," Electronics Letters, vol. 14, No. 4, Feb. 16, 1978, pp. 100-101.

Hassani, M. M. Shahidul et al., "Breakdown voltages of base-collector junctions of high-voltage power transistors with graded collectors," International Journal of Electronics, vol. 70, No. 1, 1991, pp. 77-83.

Humphreys, M.J. et al., "Control of Avalanche Injection in Bipolar Transistors Through the use of Graded Collector Impurity Profiles," IEE Proceedings, vol. 134, Pt. I, No. 5, Oct. 1987, pp. 141-147.

Ohara, S. et al., "InGaP/GaAs Power HBTs with a Low Bias Voltage," IEDM, 1995, IEEE, pp. 791-794.

Suzuki, S. et al., "A New Approach to Prevent the Burnout Under Mismatching Load Conditions in High Power HBT," 29th European Microwave Conference, 1999, Munich, Germany, pp. 117-120.

Tateno, Y. et al., "3.5V, 1W High Efficiency AlGaAS/GaAs HBTs with Collector Launcher Structure," IEDM, 1994, IEEE, pp. 195-198.

* cited by examiner

HETEROJUNCTION BIPOLAR TRANSISTOR ARCHITECTURE

RELATED APPLICATIONS

This application claims the benefit of U.S. provisional patent application No. 62/142,203, filed Apr. 2, 2015, the disclosure of which is incorporated herein by reference in its entirety.

FIELD OF THE DISCLOSURE

The present disclosure relates to transistors, and specifically to bipolar transistors with improved linearity and ruggedness.

BACKGROUND

Transistors such as heterojunction bipolar transistors (HBTs) are widely used in many different applications. For example, one or more HBTs may be provided in a power amplifier (PA) for radio frequency (RF) communications circuitry. As RF communications standards continue to evolve, the performance requirements of RF communications circuitry, and in particular those placed on RF PAs, are becoming increasingly stringent. Accordingly, designers are continually striving to improve RF PA performance parameters such as RF gain and linearity.

To improve the performance of HBTs for RF PAs, designers have previously altered a doping profile of a collector in the device. Generally, these improvements have provided an increase in one performance parameter such as linearity while degrading another such as RF gain. Further, these previous approaches have generally provided improvements in second channel linearity measures such as alternative channel power ratio (ACPR2) and alternative channel leakage power ratio (ACLR2). As discussed above, modern RF communications standards demand high performance across a range of different performance parameters. Accordingly, there is a need for an improved bipolar transistor device.

SUMMARY

The present disclosure relates to transistors, and specifically to bipolar transistors with improved linearity and ruggedness. In one embodiment, a transistor includes a sub-collector, a base, a collector between the sub-collector and the base, and an emitter on the base opposite the collector. The collector includes a first region adjacent to the base and a second region between the first region and the sub-collector. The first region has a graduated doping profile such that a doping concentration of the first region decreases in proportion to a distance from the base. The second region has a substantially constant doping profile. By providing the collector with a doping profile as described, the linearity of the transistor is significantly improved while maintaining the radio frequency (RF) gain thereof.

In one embodiment, the doping concentration of the first region decreases by more than an order of magnitude between the base and the second region.

In one embodiment, the doping concentration of the first region is between about $3 \times 10^{16}$ cm$^{-3}$ and $9 \times 10^{16}$ cm$^{-3}$ near the base and between about $1 \times 10^{15}$ cm$^{-3}$ and $1 \times 10^{16}$ cm$^{-3}$ near the second region. In one embodiment, the doping concentration of the second region is between about $1 \times 10^{15}$ cm$^{-3}$ and $1 \times 10^{16}$ cm$^{-3}$.

In one embodiment, the doping concentration of the first region is graduated linearly, or in a number of steps that approximate a linear response. In another embodiment, the doping concentration of the first region is graduated parabolically. The doping concentration of the first region may further be graduated exponentially.

In one embodiment, the first region has a thickness between about 1000 Å and 3000 Å. The second region may have a thickness between about 0 Å and 8000 Å.

In one embodiment, the transistor is a heterojunction bipolar transistor.

In one embodiment, the collector further includes a third region between the second region and the sub-collector. The third region may have a graduated doping profile such that a doping concentration of the third region increases in proportion to a distance from the second region.

In one embodiment, the third region has a doping concentration between about $1 \times 10^{16}$ cm$^{-3}$ and $5 \times 10^{16}$ cm$^{-3}$ near the second region and a doping concentration between about $5 \times 10^{16}$ cm$^{-3}$ and $5 \times 10^{18}$ cm$^{-3}$ near the sub-collector. The doping concentration of the third region may be graduated linearly, parabolically, or exponentially in various embodiments.

The third region may have a thickness between about 2000 Å and 5000 Å.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
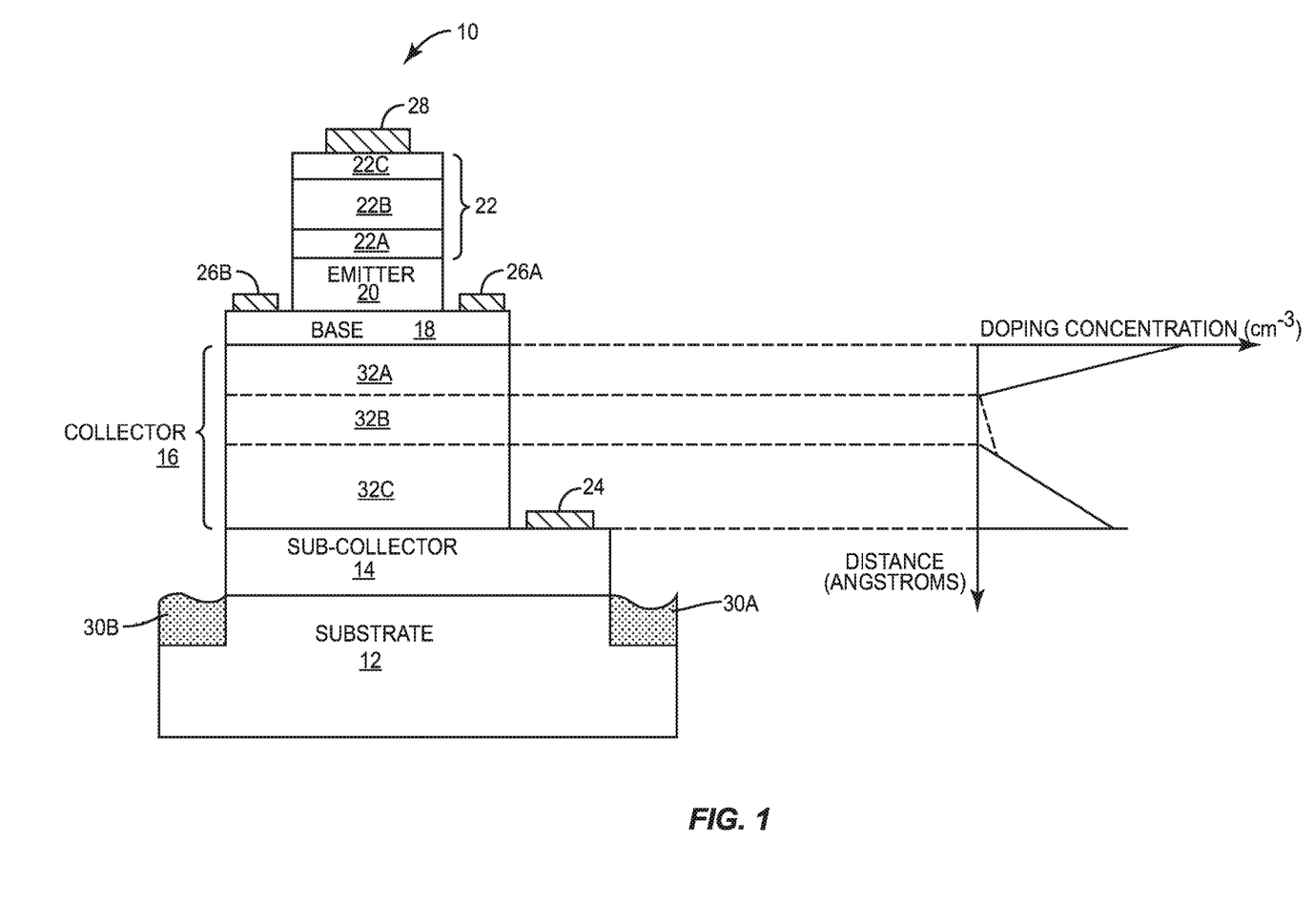
FIG. 1 is a cross-sectional view of a heterojunction bipolar transistor according to one embodiment of the present disclosure.

FIG. 1 shows a cross-section of a heterojunction bipolar transistor 10 according to one embodiment of the present disclosure. The heterojunction bipolar transistor 10 includes a substrate 12, a sub-collector 14 over the substrate 12, a collector 16 over the sub-collector 14, a base 18 over the collector 16, an emitter 20 over the base 18, and an emitter contact stack 22 over the emitter 20. The heterojunction bipolar transistor 10 is tiered such that the device includes a number of different mesas on which contacts to the various portions of the device are provided. A first mesa on the sub-collector 14 includes a collector contact 24, such that the collector contact 24 is on a surface of the sub-collector 14. A second mesa on the base 18 includes a first base contact 26A and a second base contact 26B, such that the first base contact 26A and the second base contact 26B are on a surface of the base 18. A third mesa on the emitter contact stack 22 on top of the heterojunction bipolar transistor 10 includes an emitter contact 28, such that the emitter contact 28 is on a surface of the emitter contact stack 22. The heterojunction bipolar transistor 10 may be surrounded by a first isolation region 30A and a second isolation region 30B in some embodiments to electrically isolate the heterojunction bipolar transistor 10 from other adjacent devices. The emitter contact stack 22 includes an emitter cap layer 22A over the emitter 20, a bottom emitter contact layer 22B over the emitter cap layer 22A, and a top emitter contact layer 22C over the bottom emitter contact layer 22B.

As discussed above, a doping profile of the collector 16 may affect device parameters of the heterojunction bipolar transistor 10 such as linearity, ruggedness, and radio frequency (RF) gain. Previous doping schemes have generally resulted in improvement of one or more of these parameters at the expense of the others. In an effort to simultaneously improve linearity, ruggedness, and RF gain, the collector 16 is vertically divided into a first collector region 32A adjacent to the base 18, a second collector region 32B below the first collector region 32A, and a third collector region 32C below the second collector region 32B and adjacent to the sub-collector 14. A graph in FIG. 1 illustrates a doping profile of the first collector region 32A, the second collector region 32B, and the third collector region 32C. In particular, a doping profile of the first collector region 32A is graded, such that a doping concentration of the first collector region 32A decreases in proportion to a distance from the base 18. A doping profile of the second collector region 32B is substantially constant. A doping profile of the third collector region 32C is graduated such that a doping concentration of the third collector region 32C decreases in proportion to a distance from the sub-collector 14.

The doping concentration of the first collector region 32A may start between about $3 \times 10^{16}$ and $9 \times 10^{16}$ at the junction between the first collector region 32A and the base 18, and may decrease as the vertical distance from the base 18 increases such that the doping concentration of the first collector region 32A is between about $1 \times 10^{15}$ cm$^{-3}$ and $1 \times 10^{16}$ cm$^{-3}$ at the junction between the first collector region 32A and the second collector region 32B. In one embodiment, the doping concentration of the first collector region 32A decreases linearly between the base 18 and the second collector region 32, however, the doping concentration of the first collector region 32A may be designed to decrease exponentially, parabolically, in a step-wise approximation of any of the above, or in any other suitable fashion without departing from the principles of the present disclosure. The doping concentration of the second collector region 32B may be between about $1 \times 10^{15}$ cm$^{-3}$ and $1 \times 10^{16}$ cm$^{-3}$, and, may substantially constant throughout the region or increase slightly in proportion to a distance from the first collector region 32A as shown by the dashed line. The doping concentration of the third collector region 32C may increase as the vertical distance from the second collector region 32B increases such that the doping concentration of the third collector region is between about $1 \times 10^{16}$ cm$^{-3}$ and $5 \times 10^{16}$ cm$^{-3}$ at the junction between the third collector region 32C and the second collector region 32B, and may increase as the vertical distance from the second collector region 32B increases such that a doping concentration of the third collector region 32C is between about $5 \times 10^{16}$ cm$^{-3}$ and $5 \times 10^{18}$ cm$^{-3}$ at the junction between the third collector region 32C and the sub-collector 14. In one embodiment, the doping concentration of the third collector region 32C increases linearly between the second collector region 32B and the sub-collector 14, however, the doping concentration of the third collector region 32C may be designed to increase exponentially, parabolically, in a step-wise approximation of any of the above, or in any other suitable fashion without departing from the principles of the present disclosure.

The first collector region 32A may have a thickness between about 1000 Å and 3000 Å. The second collector region 32B may have a thickness between about 0 Å and 8000 Å. The third collector region 32C may have a thickness between about 2000 Å and 5000 Å. Notably, these thicknesses are for a handheld wireless communications device. Infrastructure devices such as base stations and enhanced node-B's may require devices capable of handling greater amounts of power, and thus the thicknesses may be increased to allow for this increased power handling. Providing the collector 16 as described above improves the linearity of the heterojunction bipolar transistor 10 without sacrificing other performance parameters such as RF gain. In particular, providing the first collector region 32A with a graduated doping profile flattens a relationship between a cutoff frequency ($f_T$) of the heterojunction bipolar transistor 10 and a current density thereof. This effectively linearizes the response of the heterojunction bipolar transistor 10, especially when the heterojunction bipolar transistor 10 is provided in power amplifier circuitry along with one or more other heterojunction bipolar transistors as discussed below. The increase in linearity experienced by the heterojunction bipolar transistor 10 is specifically with respect to first channel linearity parameters such as adjacent channel power ratio (ACPR1) and adjacent channel leakage power ratio (ACLR1), unlike conventional devices which have generally only been able to achieve improvements to second channel linearity parameters such as alternative channel power ratio (ACPR2) and alternative channel leakage power ratio (ACLR2). Since designers are generally more concerned with first channel linearity effects, the heterojunction bipolar transistor 10 is thus preferred over conventional devices. Further, while the improvements achieved by conventional devices with respect to second channel linearity have generally come at the cost of decreased RF gain, the improvements to the linearity of the heterojunction bipolar transistor 10 described herein are achieved with minimal effect on the RF gain.

Providing the third collector region 32C with a graduating doping profile effectively delays base push-out due to the Kirk Effect (by distributing the electric field to prevent reversal of charge in the depletion region when operating the device), which further contributes to the flattening of the cutoff frequency ($f_T$) vs. current density response of the heterojunction bipolar transistor 10 and also prevents a decrease in breakdown voltage in order to increase the ruggedness of the device. In some embodiments, the first collector region 32A may sufficiently improve the performance of the heterojunction bipolar transistor 10 such that the third collector region 32C may be omitted. In these embodiments, a thickness of the first collector region 32A and/or the second collector region 32B may be increased to compensate for the missing third collector region 32C.

The substrate 12 may be a semi-insulating substrate in some embodiments. The doping concentrations and thicknesses of the other layers of the heterojunction bipolar transistor 10 may be chosen according to standard design principles and thus may vary depending on the application.

The various parts of the heterojunction bipolar transistor 10 may be designed using a variety of materials systems. In one exemplary embodiment, the substrate 12, the sub-collector 14, the collector 16, the base 18, the emitter cap layer 22A, and the bottom emitter contact layer 22B are gallium arsenide (GaAs) layers, the emitter 20 is an indium gallium phosphide (InGaP) layer, and the top emitter contact layer 22C is an indium gallium arsenide (InGaAs) layer. Those skilled in the art will appreciate that the principles of the present disclosure may apply to any number of different materials systems, all of which are contemplated herein.

As shown in FIG. 1, the substrate 12, the sub-collector 14, the collector 16, the emitter 20, and the emitter contact stack 22 are n-type layers, while the base 18 is a p-type layer. Accordingly, the heterojunction bipolar transistor 10 is shown as an N-P-N device. However, the present disclosure is not so limited. In other embodiments, the substrate 12, the sub-collector 14, the collector 16, the emitter 20, and the emitter contact stack 22 may be p-type layers, while the base 18 may be an n-type layer, such that the heterojunction bipolar transistor 10 is a P-N-P device. Examples of n-type dopants that may be used in the various parts of the heterojunction bipolar transistor 10 include silicon, tellurium, and selenium. Examples of p-type dopants that may be used in the various parts of the heterojunction bipolar transistor 10 include carbon and beryllium.

Figure 2:
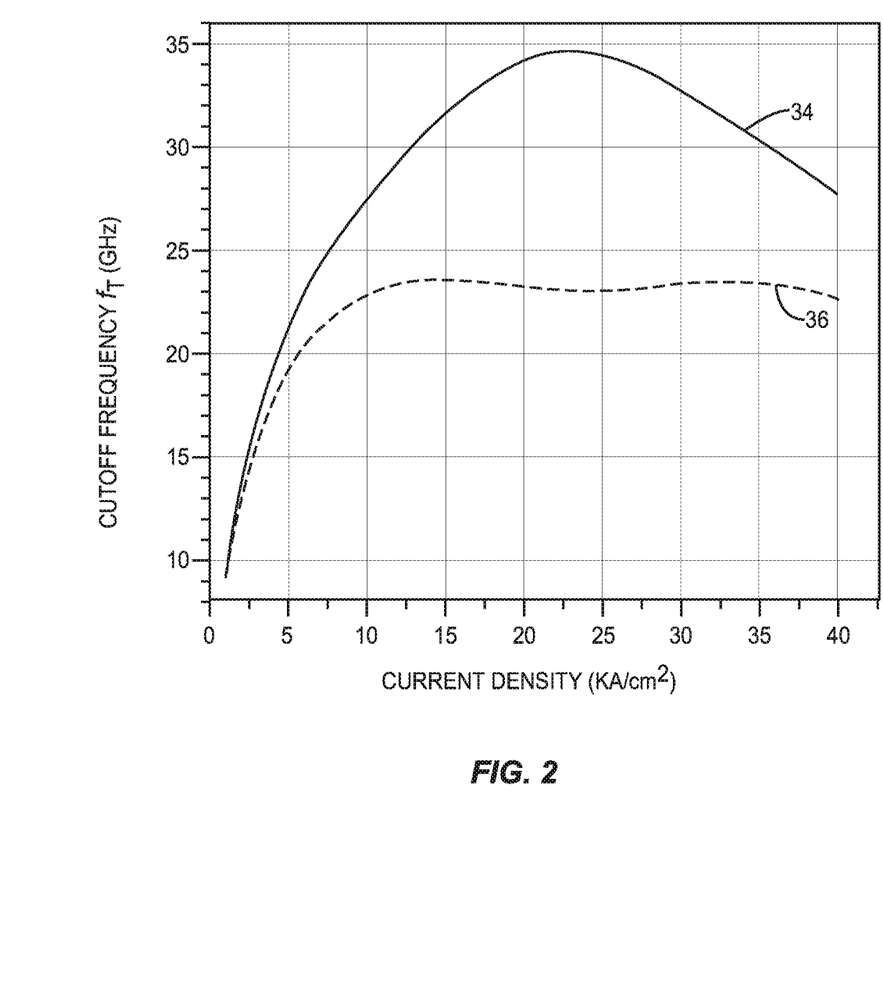
FIG. 2 is a graph illustrating the small signal performance advantages of a heterojunction bipolar transistor according to one embodiment of the present disclosure.

FIG. 2 is a graph illustrating the performance improvements of the heterojunction bipolar transistor 10 compared to conventional devices. A solid line 34 shows a cutoff frequency ($f_T$) vs. current density response of a conventional heterojunction bipolar transistor. As illustrated by the solid line 34, the cutoff frequency ($f_T$) vs. current density response of the conventional heterojunction bipolar transistor is not linear. A dashed line 36 shows a cutoff frequency ($f_T$) vs. current density response of the heterojunction bipolar transistor 10 discussed above. As illustrated by the dashed line 36, after a minimum current density threshold, the cutoff frequency ($f_T$) vs. current density response of the heterojunction bipolar transistor 10 is substantially linear. As will be appreciated by those skilled in the art, the cutoff frequency ($f_T$) vs. current density response of a device is closely related to the linearity thereof. Accordingly, the heterojunction bipolar transistor 10 achieves significant improvements in first channel linearity parameters such as adjacent channel power ratio (ACPR1) and adjacent channel power leakage ratio (ACLR1).

Figure 3:
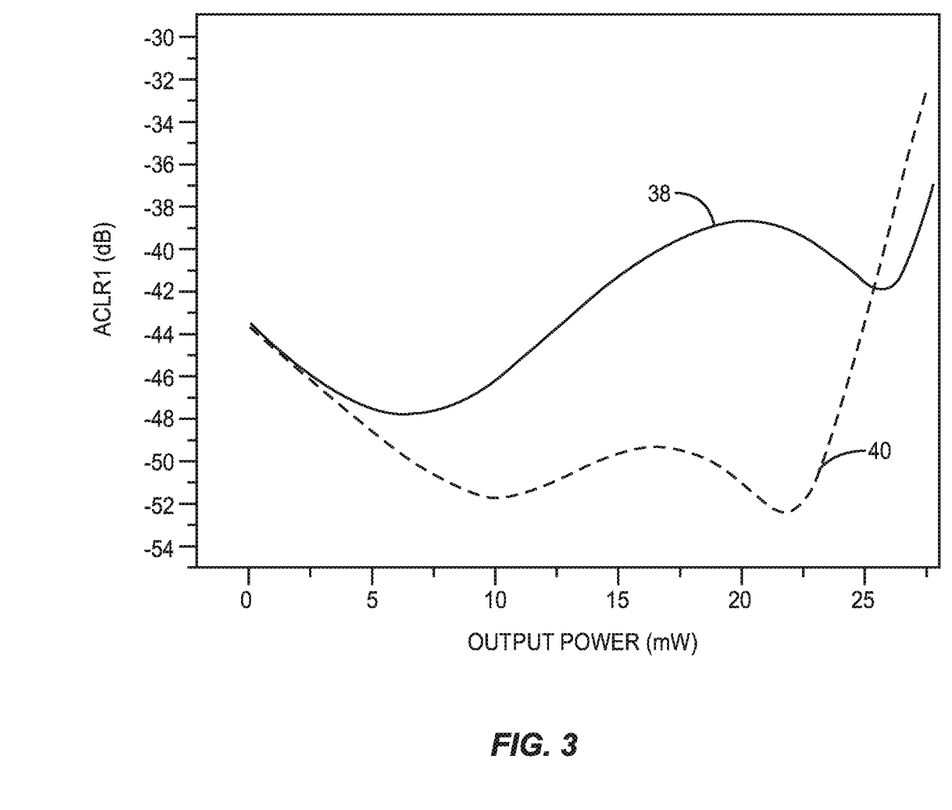
FIG. 3 is a graph illustrating the power amplifier performance advantages of a heterojunction bipolar transistor according to one embodiment of the present disclosure.

FIG. 3 is a graph further illustrating the performance improvements of the heterojunction bipolar transistor 10 compared to conventional devices. A solid line 38 shows an adjacent channel power leakage ratio (ACLR1) vs. output power ($P_{OUT}$) response of a conventional heterojunction bipolar transistor. As illustrated by the solid line 38, a peak adjacent channel power leakage ratio (ACLR1) for the conventional heterojunction bipolar transistor in the usable output power range is close to −38 dB, which is very close to the limits set for modern wireless communications standards such as long term evolution (LTE) wireless standards. A dashed line 40 shows an adjacent channel power leakage ratio (ACLR1) vs. output power ($P_{OUT}$) response for the heterojunction bipolar transistor 10 discussed above. As illustrated by the dashed line 40, a peak adjacent channel power leakage ratio (ACLR1) of the heterojunction bipolar transistor is around −49 dB within the usable power range, which is a significant improvement over conventional devices.

The improvements in adjacent channel power leakage ratio (ACLR1) afforded by the heterojunction bipolar transistor 10 may allow designers greater flexibility in improving other performance parameters of the device. For example, the "buffer" in adjacent channel power leakage ratio (ACLR1) may allow designers to increase power added efficiency (PAE) while still remaining within the limits for adjacent channel power leakage ratio (ACLR1) mandated by one or more wireless communications standards. Further, the improvements in adjacent channel power leakage ratio (ACLR1) allow designers of circuitry incorporating the heterojunction bipolar transistor 10 additional flexibility, which may result in even further gains in performance as discussed below.

Figure 4:
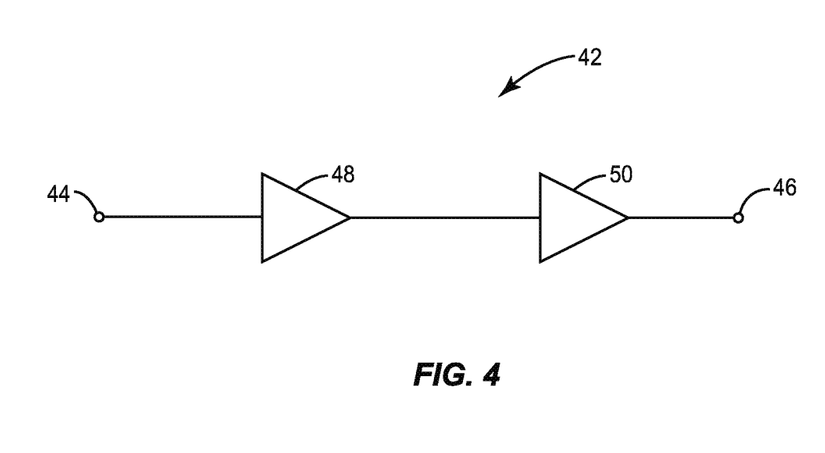
FIG. 4 is a functional schematic of a transmit chain for a wireless communications device according to one embodiment of the present disclosure.

FIG. 4 shows a transmit chain 42 for a wireless communications device according to one embodiment of the present disclosure. The transmit chain 42 includes an input node 44, an output node 46, a driver stage amplifier 48, and a final stage amplifier 50 coupled in series with the driver stage amplifier 48 between the input node 44 and the output node 46. In operation, a modulated wireless communications signal is provided at the input node 44, where it is delivered to the driver stage amplifier 48. The driver stage amplifier 48 amplifies the signal and provides it to the final stage amplifier 50. The final stage amplifier 50 further amplifies the signal and provides it to the output node 46 where it may be transmitted from an antenna. In general, the driver stage amplifier 48 is designed to operate in compression, while the final stage amplifier 50 is configured to operate in expansion. The balance between the compression of the driver stage amplifier 48 and the expansion of the final stage amplifier 50 is a large factor in determining the overall linearity of the transmit chain 42. When using conventional devices for the driver stage amplifier 48 and the final stage amplifier 50, performance parameters such as adjacent channel power leakage ratio (ACLR1) as discussed above generally limited the amount of adjustment that could be performed on the driver stage amplifier 48 and the final stage amplifier 50 in order to balance the compression and expansion thereof. Using the heterojunction bipolar transistor 10 discussed above for the driver stage amplifier 48, the final stage amplifier 50, or both, allows designers additional flexibility in setting the various parameters of the devices, which leads to a better balance between the compression of the driver stage amplifier 48 and the expansion of the final stage amplifier 50. This in turn significantly increases the linearity of the transmit chain 42.

Figure 5:
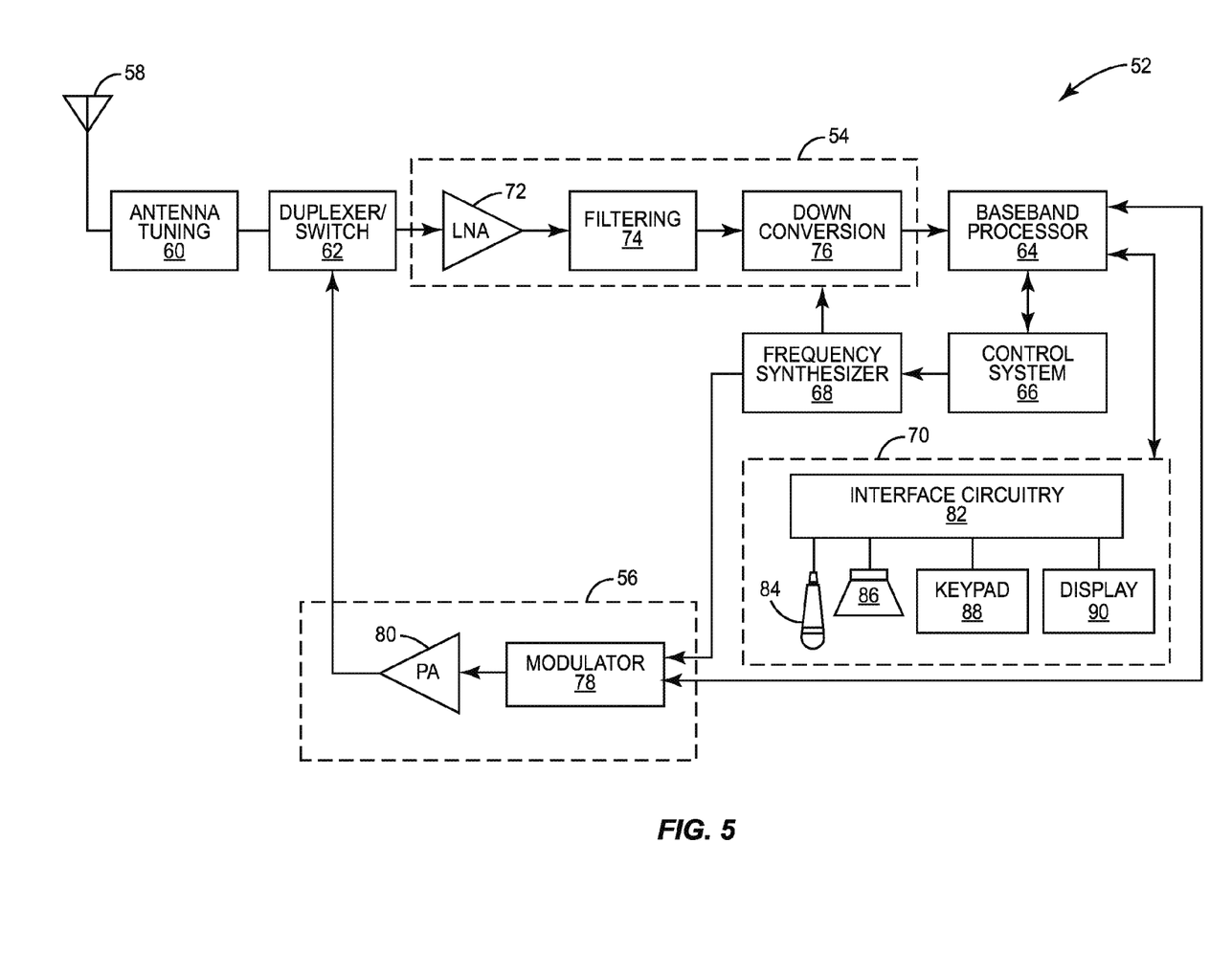
FIG. 5 is a functional schematic of a wireless communications device according to one embodiment of the present disclosure.

The heterojunction bipolar transistor 10, and in particular the RF transmit chain 42 incorporating the heterojunction bipolar transistor 10, may be used in a wireless communications device 52, the basic architecture of which is shown in FIG. 5. The wireless communications device 52 may include a receiver front end 54, a transmitter section 56, an antenna 58, antenna tuning circuitry 60, duplexer/switch circuitry 62, a baseband processor 64, a control system 66, a frequency synthesizer 68, and a user interface 70. The receiver front end 54 receives information bearing radio frequency signals from one or more remote transmitters provided by a base station (not shown). The radio frequency signals are delivered to the receiver front end 54 via the duplexer/switch circuitry 62. A low noise amplifier (LNA) 72 amplifies the signal. Filtering circuitry 74 minimizes broadband interference in the received signal, while down conversion and digitization circuitry 76 down converts the filtered received signal to an intermediate or baseband frequency signal, which is then digitized into one or more digital streams. The receiver front end 54 typically uses one or more mixing frequencies generated by the frequency synthesizer 68. The baseband processor 64 processes the digitized received signal to extract the information or data bits conveyed in the received signal. This processing typically comprises demodulation, decoding, and error correction operations. As such, the baseband processor 64 is generally implemented in one or more digital signal processors (DSPs).

On the transmit side, the baseband processor 64 receives digitized data, which may represent voice, data, or control information from the control system 66, which it encodes for transmission. The encoded data is output to the transmitter section 56, where it is used by a modulator 78 to modulate a carrier signal that is at a desired transmit frequency. Power amplifier circuitry 80 amplifies the modulated carrier signal to a level appropriate for transmission, and delivers the amplified and modulated carrier signal to the antenna 58 through the antenna tuning circuitry 60 and the duplexer/switch circuitry 62. The power amplifier circuitry 80 may incorporate the heterojunction bipolar transistor 10. Due to the performance improvements discussed above, the wireless communications device 52 may thus experience improved linearity and ruggedness while maintaining a high RF gain.

A user may interact with the wireless communications device 52 via the user interface 70, which may include interface circuitry 82 associated with a microphone 84, a speaker 86, a keypad 88, and a display 90. The interface circuitry 82 typically includes analog-to-digital converters, digital-to-analog converters, amplifiers, and the like. Additionally, it may include a voice encoder/decoder, in which case it may communicate directly with the baseband processor 64. The microphone 84 will typically convert audio input, such as the user's voice, into an electrical signal, which is then digitized and passed directly or indirectly to the baseband processor 64. Audio information encoded in the received signal is recovered by the baseband processor 64, and converted by the interface circuitry 82 into an analog signal suitable for driving the speaker 86. The keypad 88 and the display 90 enable the user to interact with the wireless communications device 52, input numbers to be dialed, address book information, or the like, as well as monitor call progress information.

Those skilled in the art will recognize improvements and modifications to the embodiments of the present disclosure. All such improvements and modifications are considered within the scope of the concepts disclosed herein and the claims that follow.

What is claimed is:
1. A transistor comprising:
  a sub-collector;
  a base;
  a collector between the sub-collector and the base and comprising:
    a first region comprising a first end adjacent to the base and a second end opposite the first end, wherein a doping profile of the first region is graduated such that a doping concentration of the first region decreases from a first doping concentration at the first end to a second doping concentration at the second end; and
    a second region between the first region and the sub-collector and comprising a substantially constant doping profile at the second doping concentration; and
  an emitter on the base opposite the collector.
2. The transistor of claim 1 wherein the doping concentration of the first region decreases by more than an order of magnitude between the first end of the first region and the second end of the first region.

3. The transistor of claim 2 wherein the doping concentration of the first region is between about $3\times10^{16}$ cm$^{-3}$ and $9\times10^{16}$ cm$^{-3}$ at the first end of the first region and between about $1\times10^{15}$ cm$^{-3}$ and $1\times10^{16}$ cm$^{-3}$ at the second end of the first region.

4. The transistor of claim 3 wherein a doping concentration of the second region is between about $1\times10^{15}$ cm$^{-3}$ and $1\times10^{16}$ cm$^{-3}$.

5. The transistor of claim 3 wherein the doping concentration of the first region is graduated one of linearly and in a step-wise approximation of linearly.

6. The transistor of claim 3 wherein the doping concentration of the first region is graduated one of parabolically and exponentially.

7. The transistor of claim 3 wherein the first region has a thickness between about 1000 Å and 3000 Å.

8. The transistor of claim 7 wherein the second region has a thickness between about 0 Å and 8000 Å.

9. The transistor of claim 8 wherein a doping concentration of the second region is between about $1\times10^{15}$ cm$^{-3}$ and $1\times10^{16}$ cm$^{-3}$.

10. The transistor of claim 1 wherein the second region has a thickness between about 0 Å and 8000 Å.

11. The transistor of claim 10 wherein the first region has a thickness between about 1000 Å and 3000 Å.

12. The transistor of claim 1 wherein the transistor is a heterojunction bipolar transistor (HBT).

13. The transistor of claim 1 further comprising a third region comprising a first end adjacent to the second region and a second end opposite the first end, wherein a doping profile of the third region is graduated such that a doping concentration of the third region increases from the second doping concentration at the first end to a third doping concentration at the second end.

14. The transistor of claim 13 wherein:
the doping concentration of the first region decreases by more than an order of magnitude between the first end of the first region and the second end of the first region; and
the doping concentration of the third region increases by more than an order of magnitude between the first end of the third region and the second end of the third region.

15. The transistor of claim 14 wherein:
the doping concentration of the first region is between about $3\times10^{16}$ cm$^{-3}$ and $9\times10^{16}$ cm$^{-3}$ at the first end of the first region and between about $1\times10^{15}$ cm$^{-3}$ and $1\times10^{16}$ cm$^{-3}$ at the second end of the first region;
a doping concentration of the second region is between about $1\times10^{15}$ cm$^{-3}$ and $1\times10^{16}$ cm$^{-3}$; and
the doping concentration of the third region is between about $1\times10^{16}$ cm$^{-3}$ and $5\times10^{16}$ cm$^{-3}$ at the first end of the third region and between about $5\times10^{16}$ cm$^{-3}$ and $5\times10^{18}$ cm$^{-3}$ at the second end of the third region.

16. The transistor of claim 15 wherein the doping concentration of the first region is graduated one of linearly and in a step-wise approximation of linearly.

17. The transistor of claim 16 wherein the doping concentration of the third region is graduated one of linearly, parabolically, and exponentially.

18. The transistor of claim 15 wherein the doping concentration of the first region is graduated one of parabolically and exponentially.

19. The transistor of claim 18 wherein the doping concentration of the third region is graduated one of linearly, parabolically, and exponentially.

20. The transistor of claim 15 wherein:
the first region has a thickness between about 1000 Å and 3000 Å;
the second region has a thickness between about 0 Å and 8000 Å; and
the third region has a thickness between about 2000 Å and 5000 Å.

* * * * *